United States Patent
Chen et al.

(10) Patent No.: US 9,520,479 B1
(45) Date of Patent: Dec. 13, 2016

(54) LOW-TEMPERATURE EPITAXIAL METHOD FOR MANUFACTURING BACKSIDE FIELD STOP LAYER OF INSULATED GATE BIPOLAR TRANSISTOR (IGBT)

(71) Applicant: PFC Device Holdings Limited, Hong Kong (HK)

(72) Inventors: Mei-Ling Chen, New Taipei (TW); Kuan-Yu Chen, New Taipei (TW)

(73) Assignee: PFC DEVICE HOLDINGS LIMITED, Hong Kong (HK)

( * ) Notice: Subject to any disclaimer, the term of this patent is extended or adjusted under 35 U.S.C. 154(b) by 0 days.

(21) Appl. No.: 15/046,294

(22) Filed: Feb. 17, 2016

(30) Foreign Application Priority Data

Nov. 30, 2015 (TW) ............................. 104140003 A

(51) Int. Cl.
| | |
|---|---|
| *H01L 21/332* | (2006.01) |
| *H01L 29/66* | (2006.01) |
| *H01L 29/417* | (2006.01) |
| *H01L 21/02* | (2006.01) |

(52) U.S. Cl.
CPC ..... *H01L 29/66333* (2013.01); *H01L 21/0262* (2013.01); *H01L 29/41708* (2013.01)

(58) Field of Classification Search
CPC ........... H01L 29/66333; H01L 21/0262; H01L 29/41708
See application file for complete search history.

(56) References Cited

U.S. PATENT DOCUMENTS

| | | | |
|---|---|---|---|
| 5,242,530 A * | 9/1993 | Batey | C23C 16/04 117/90 |
| 6,162,665 A * | 12/2000 | Zommer | H01L 29/66333 148/DIG. 126 |
| 6,884,644 B1 | 4/2005 | Slater, Jr. et al. | |
| 2012/0025261 A1 | 2/2012 | Bobde et al. | |
| 2014/0346562 A1* | 11/2014 | Tang | H01L 29/66348 257/139 |

OTHER PUBLICATIONS

Office Action dated Aug. 2, 2016 of the corresponding Taiwan patent application.

* cited by examiner

*Primary Examiner* — Bradley K Smith
(74) *Attorney, Agent, or Firm* — Chun-Ming Shih; HDLS IPR SERVICES

(57) ABSTRACT

A low-temperature epitaxial method manufactures backside field stop layer of insulated gate bipolar transistor (IGBT) first provides a first conductive type substrate and fabricates front-side elements and front metal layer on a front side of the IGBT. A second conductive type impurity layer is formed on a back side of the first conductive type substrate by low-temperature epitaxial process and a collector metal layer is formed on bottom face of the first conductive type substrate.

6 Claims, 3 Drawing Sheets

US 9,520,479 B1

LOW-TEMPERATURE EPITAXIAL METHOD FOR MANUFACTURING BACKSIDE FIELD STOP LAYER OF INSULATED GATE BIPOLAR TRANSISTOR (IGBT)

BACKGROUND OF THE INVENTION

Field of the Invention

The present invention relates to a method for manufacturing insulated gate bipolar transistor (IGBT), especially to a low-temperature epitaxial method for manufacturing backside field stop layer of IGBT.

Description of Prior Art

Insulated gate bipolar transistor (IGBT) is a semiconductor device combining the features of metal-oxide-semiconductor field effect transistor (MOSFET) and bipolar junction transistor (BJT). IGBT has the advantages of gate-controlling ability of MOSFET and low turn-on voltage of BJT and is thus extensively used in high voltage and high power applications.

A conventional IGBT, such as a punch through (PT) IGBT, mainly comprises a P+ semiconductor substrate and N− buffer layer arranged thereon. An N epitaxial layer is formed on the N− buffer layer and functions as drain of parasitic MOSFET in the IGBT. Moreover, a gate and an emitter are formed in the N epitaxial layer, and a collector is formed on bottom face of the P+ substrate. The breakdown voltage of the PT IGBT is determined by the P+ substrate and N− buffer layer because a maximum electric field is generated therebetween.

Another conventional IGBT, such as a non-punch through (NPT) IGBT, does not use N− buffer layer. The breakdown voltage is determined by the avalanche mechanism of the N epitaxial (N drift) layer. To increase the breakdown voltage, field stop (FS) IGBT was developed where the N− buffer layer in PT IGBT is replaced by a field stop ion implantation layer. Therefore, the abrupt junction in the PT IGBT is also replaced by a graded (such as a linearly graded) N type profile. The value of the maximum electric field can be advantageously reduced to enhance breakdown voltage.

In the conventional IGBT with field stop layer, the backside field stop layer is needed to be fabricated on backside of the device before forming the front side electrode (generally electrode containing aluminum). The aluminum has melting point around 630 centigrade degree, while the thermal driving-in step after the ion implantation for the field stop layer needs high temperature of 900 centigrade degree, which will damage the aluminum-based electrode. However, in conventional process for IGBT with field stop layer, protection layer is first used to protect the front side of the IGBT semi-finished product, which has not the front side electrode, and then the backside field stop layer is fabricated. Therefore, the manufacture process is complicated.

SUMMARY OF THE INVENTION

It is an object of the present invention to provide a low-temperature epitaxial method for manufacturing backside field stop layer of insulated gate bipolar transistor (IGBT) to simplify the manufacture process.

Accordingly, the present invention provides a low-temperature epitaxial method for manufacturing backside field stop layer of insulated gate bipolar transistor (IGBT), the method comprising: (a) providing a first conductive type substrate and forming front side elements of IGBT and front side metal layer of IGBT on a front side of the first conductive type substrate; (b) forming a plurality of second conductive type impurity layers on a back side of the first conductive type substrate by low-temperature epitaxial process; (c) forming a first conductive type impurity layer on the back side of the first conductive type substrate by low-temperature epitaxial process; and (d) forming a collector metal layer med on a bottom face of the first conductive type substrate.

By the above-mentioned process, the field stop layer is fabricated after the formation of the front side metal layer, thus simplifying manufacture and reducing cost.

Moreover, the method of the present invention can form multiple field stop layers (each with different impurity concentrations), thus increasing breakdown voltage.

BRIEF DESCRIPTION OF DRAWING

One or more embodiments of the present disclosure are illustrated by way of example and not limitation in the figures of the accompanying drawings, in which like references indicate similar elements. These drawings are not necessarily drawn to scale.

DETAILED DESCRIPTION OF THE INVENTION

FIGS. 1 to 5 are sectional views showing the steps of low-temperature epitaxial method for manufacturing backside field stop layer of insulated gate bipolar transistor (IGBT) according to an embodiment of the present invention. With also reference to FIG. 6, this figure shows the flowchart of low-temperature epitaxial method for manufacturing backside field stop layer of IGBT according to an embodiment of the present invention. As shown in FIG. 6, the low-temperature epitaxial method for manufacturing backside field stop layer of IGBT comprises following steps: (S10) providing a first conductive type substrate and forming front side elements of IGBT and front side metal layer of IGBT on a front side of the first conductive type substrate; (S12) forming a plurality of second conductive type impurity layers on a back side of the first conductive type substrate by low-temperature epitaxial process; (S14) forming a first conductive type impurity layer on the back side of the first conductive type substrate by low-temperature epitaxial process; and (S16) forming a collector metal layer med on a bottom face of the first conductive type substrate. The more detailed description for the method will be made with reference to FIGS. 1 to 5.

Figure 1:
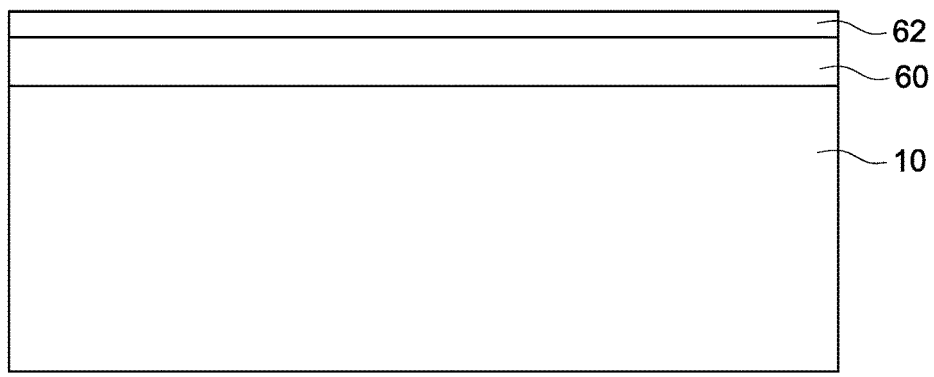
FIGS. 1 to 5 are sectional views showing the steps of low-temperature epitaxial method for manufacturing backside field stop layer of insulated gate bipolar transistor (IGBT) according to an embodiment of the present invention.
Figure 2:
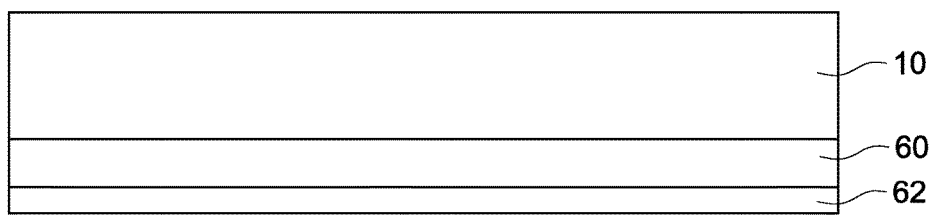

As shown in FIG. 1, an N type (first conductive type) substrate 10 is prepared and front side MOSFET elements 60 and front side metal layer 62 are formed on the N type substrate 10 by conventional process. As shown in FIG. 2, the N type substrate 10 is polished at back side thereof, then stress release wet etching and cleaning are performed for the N type substrate 10 to thin the N type substrate 10 (namely, decrease the thickness of the N type substrate 10). The remaining thickness of the N type substrate 10 is relevant to the demanded voltage tolerance for the IGBT to be manufactured. Afterward, low temperature epitaxial process such as plasma-enhanced chemical vapor deposition (PECVD)

process is conducted to form a plurality of phosphor-doped single-crystalline silicon layers, such as four layers of phosphor-doped single-crystalline silicon layers 20A-20D, on the backside of the N type substrate 10. PECVD is a process used to deposit thin films from a gas state (vapor) to a solid state on a substrate. Chemical reactions are involved in the process, which occur after creation of plasma of the reacting gases. The plasma is generally created by RF (AC) frequency or DC discharge between two electrodes, the space between which is filled with the reacting gases. The chemical reactions are assisted plasma to advantageously reduce reaction temperature. In the process shown in FIG. 3, the reaction temperature is for example below 600 centigrade degree to prevent the front side metal layer 62 from influence.

Figure 3:
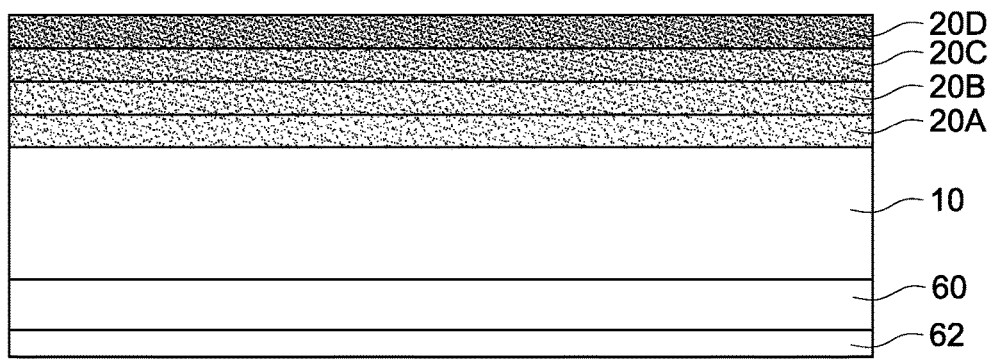

As also shown in FIG. 3, there are four layers of phosphor-doped single-crystalline silicon layers 20A-20D on the backside of the N type substrate 10 and the phosphor-doped single-crystalline silicon layers 20A-20D have different impurity concentrations to function as field stop layers for the IGBT. More particularly, impurity concentrations of the phosphor-doped single-crystalline silicon layers 20A-20D are decreased from the backside of the N type substrate 10. Namely, the first field stop layer (the phosphor-doped single-crystalline silicon layer 20A) has the highest impurity concentration, the second field stop layer (the phosphor-doped single-crystalline silicon layer 20B) has the second highest impurity concentration, the third field stop layer (the phosphor-doped single-crystalline silicon layer 20C) has the third highest impurity concentration and the fourth field stop layer (the phosphor-doped single-crystalline silicon layer 20D) has the lowest impurity concentration. Moreover, the range of the impurity concentrations is between $1 \times 10^{13}$ cm$^{-3}$ and $1 \times 10^{16}$ cm$^{-3}$. Namely, the first field stop layer 20A has the highest impurity concentration and its impurity concentration is still below $1 \times 10^{16}$ cm$^{-3}$; the fourth field stop layer 20D has the lowest impurity concentration and its impurity concentration is still higher than $1 \times 10^{13}$ cm$^{-3}$ to achieve desired device performance.

Figure 4:
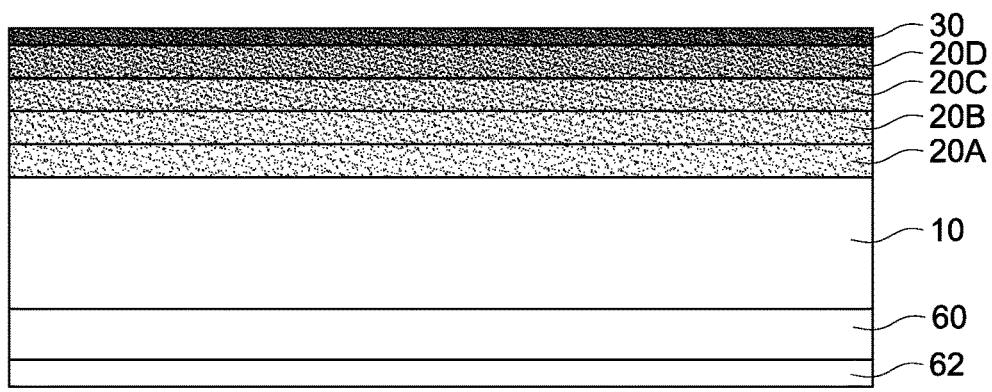

As shown in FIG. 4, after forming the phosphor-doped single-crystalline silicon layers 20A-20D, a boron doped layer 30 is then formed with low-temperature epitaxial process such as PECVD process. The reaction temperature of the PECVD process is below 600 centigrade degree to prevent the front side metal layer 62 from influence.

Figure 5:
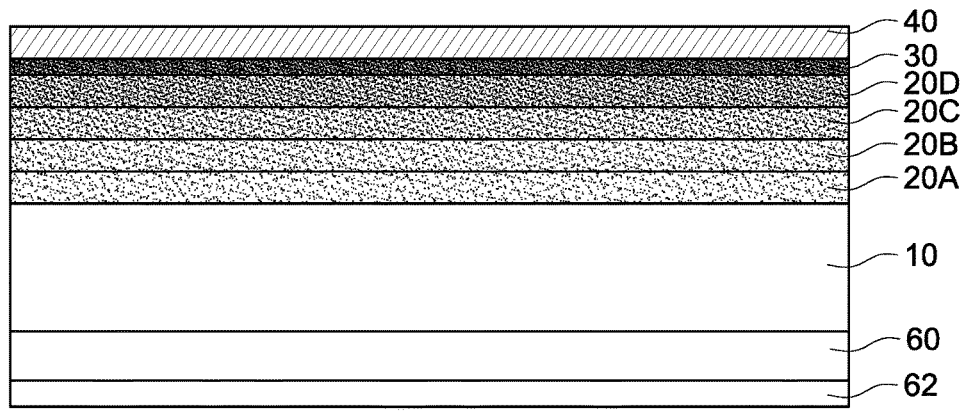
Figure 6:
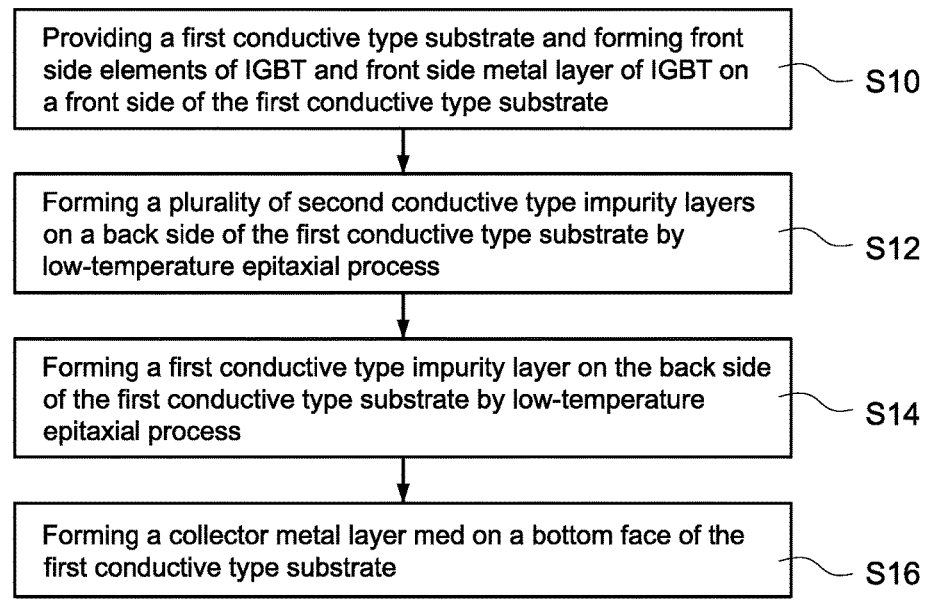
FIG. 6 shows the flowchart of low-temperature epitaxial method for manufacturing backside field stop layer of IGBT according to an embodiment of the present invention.

As shown in FIG. 5, a backside metal layer is formed on the back side of the N type substrate 10 to function as the collector metal layer 80 of the IGBT. The material of the collector metal layer 80 can be, for example but not limited to, aluminum (Al), TiN or tungsten (W).

By the above-mentioned process, the field stop layer is fabricated after the formation of the front side metal layer, thus simplifying manufacture and reducing cost.

Moreover, the method of the present invention can form multiple field stop layers (each with different impurity concentrations), thus increasing breakdown voltage.

The person skilled in the art can know other implementations are also feasible for above-mentioned embodiment. For example, the N type substrate 10 can be replaced with P type substrate, and correspondingly the N type doping is replaced with P type doping, and vice versa.

Thus, particular embodiments have been described. Other embodiments are within the scope of the following claims. For example, the actions recited in the claims may be performed in a different order and still achieve desirable results.

What is claimed is:

1. A low-temperature epitaxial method for manufacturing backside field stop layer of insulated gate bipolar transistor (IGBT), the method comprising:
   (a) providing a first conductive type substrate and forming front side elements of IGBT and front side metal layer of IGBT on a front side of the first conductive type substrate;
   (b) forming a plurality of first conductive type impurity layers on a back side of the first conductive type substrate by low-temperature epitaxial process;
   (c) forming a second conductive type impurity layer on the back side of the first conductive type substrate by low-temperature epitaxial process; and
   (d) forming a collector metal layer med on a bottom face of the first conductive type substrate,
   wherein impurity concentrations of the first conductive type impurity layers formed in step (b) are decreased from a backside of the first conductive type substrate.

2. The low-temperature epitaxial method in claim 1, wherein the low-temperature epitaxial process is plasma-enhanced chemical vapor deposition (PECVD) process.

3. The low-temperature epitaxial method in claim 1, wherein the first conductive type is N type or P type.

4. The low-temperature epitaxial method in claim 1, wherein four layers of first conductive type impurity layers are formed in step (b) to function as field stop layers.

5. The low-temperature epitaxial method in claim 1, wherein a range of the impurity concentrations is between $1 \times 10^{13}$ cm$^{-3}$ and $1 \times 10^{16}$ cm$^{-3}$.

6. The low-temperature epitaxial method in claim 1, wherein material of the collector metal layer is aluminum (Al), TiN or tungsten (W).

* * * * *